(12) United States Patent
Ranjan et al.

(10) Patent No.: US 9,158,874 B1
(45) Date of Patent: Oct. 13, 2015

(54) FORMAL VERIFICATION COVERAGE METRICS OF COVERED EVENTS FOR CIRCUIT DESIGN PROPERTIES

(71) Applicant: Jasper Design Automation, Inc., Mountain View, CA (US)

(72) Inventors: Rajeev K. Ranjan, Sunnyvale, CA (US); Ross M. Weber, Plymouth, MN (US); Habeeb A. Farah, Nazareth (IL); Ziyad E. Hanna, Haifa (IL)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/073,787

(22) Filed: Nov. 6, 2013

(51) Int. Cl.
G06F 17/50 (2006.01)

(52) U.S. Cl.
CPC ............ G06F 17/5045 (2013.01); G06F 17/50 (2013.01); *G06F 17/504* (2013.01); *G06F 17/5081* (2013.01)

(58) Field of Classification Search
CPC ... G06F 17/50; G06F 17/504; G06F 17/5045; G06F 17/5081
USPC .................................. 716/106, 108, 111, 136
See application file for complete search history.

(56) References Cited

U.S. PATENT DOCUMENTS

| 6,975,976 | B1 | 12/2005 | Casavant et al. |
| 7,124,383 | B2* | 10/2006 | Chen et al. ................... 716/106 |
| 7,249,332 | B1 | 7/2007 | Agmon |
| 7,318,205 | B2* | 1/2008 | Levitt et al. .................. 716/106 |
| 7,325,206 | B2 | 1/2008 | White et al. |
| 7,412,674 | B1* | 8/2008 | Singhal et al. ............... 716/106 |
| 7,421,668 | B1* | 9/2008 | Ip et al. ......................... 716/108 |
| 7,454,324 | B1 | 11/2008 | Seawright et al. |
| 7,458,046 | B2 | 11/2008 | Ghosh et al. |
| 7,571,398 | B2* | 8/2009 | Bormann et al. ............ 716/106 |
| 7,730,436 | B2* | 6/2010 | Khasidashvili et al. ...... 716/106 |
| 7,890,897 | B2* | 2/2011 | Levitt et al. .................. 716/136 |
| 7,895,552 | B1 | 2/2011 | Singhal et al. |
| 7,979,262 | B1 | 7/2011 | Iyengar et al. |
| 8,005,009 | B2 | 8/2011 | McKee et al. |
| 8,103,999 | B1* | 1/2012 | Martensson .................. 716/106 |
| 8,166,430 | B2* | 4/2012 | Bormann et al. ............ 716/106 |
| 8,219,944 | B2 | 7/2012 | Song et al. |
| 8,326,592 | B2 | 12/2012 | McMillan |

(Continued)

OTHER PUBLICATIONS

U.S. Appl. No. 13/288,836, filed Nov. 3, 2011.

(Continued)

*Primary Examiner* — Helen Rossoshek
(74) *Attorney, Agent, or Firm* — Vista IP Law Group, LLP (57) ABSTRACT

A computer-implemented method and non-transitory computer readable medium for circuit design verification. A property defined for a circuit design is received, the property having a cone of influence in the circuit design corresponding to a portion of the circuit design capable of affecting the property. Bounded reachability analysis is performed for the circuit design against a set of cover items. The set of cover items are classified into classified cover items based on results of the reachability analysis. Coverage information is generated indicating an amount of formal verification coverage provided by the property. The coverage information is generated based on a first set of the classified cover items that correspond to the cone of influence of the property and that are reached within a particular bound during the reachability analysis.

20 Claims, 7 Drawing Sheets

(56) References Cited

U.S. PATENT DOCUMENTS

| | | | |
|---|---|---|---|
| 8,381,148 B1* | 2/2013 | Loh et al. | 716/106 |
| 8,381,152 B2 | 2/2013 | Lai et al. | |
| 8,402,438 B1 | 3/2013 | Andrews et al. | |
| 8,418,121 B2* | 4/2013 | Levitt et al. | 716/136 |
| 8,527,936 B2 | 9/2013 | Jain et al. | |
| 8,572,527 B1 | 10/2013 | Coelho et al. | |
| 8,645,887 B2 | 2/2014 | Lai et al. | |
| 8,677,301 B2 | 3/2014 | Lai et al. | |
| 8,701,060 B2* | 4/2014 | Brinkmann | 716/106 |
| 8,739,092 B1* | 5/2014 | Ben-Tzur et al. | 716/108 |
| 2002/0108093 A1 | 8/2002 | Moondanos et al. | |
| 2002/0144218 A1 | 10/2002 | Levin et al. | |
| 2003/0110474 A1 | 6/2003 | Ur et al. | |
| 2003/0115564 A1 | 6/2003 | Chang et al. | |
| 2004/0093574 A1 | 5/2004 | Moondanos et al. | |
| 2004/0230927 A1* | 11/2004 | Chen et al. | 716/5 |
| 2004/0268274 A1 | 12/2004 | Khasidashvili et al. | |
| 2005/0005251 A1 | 1/2005 | Moondanos et al. | |
| 2005/0114805 A1 | 5/2005 | Novakovsky et al. | |
| 2006/0010428 A1 | 1/2006 | Rushby et al. | |
| 2007/0022394 A1 | 1/2007 | Ghosh et al. | |
| 2007/0180414 A1 | 8/2007 | Harer et al. | |
| 2008/0066032 A1 | 3/2008 | Levitt et al. | |
| 2008/0103750 A1* | 5/2008 | Khasidashvili et al. | 703/16 |
| 2008/0276144 A1 | 11/2008 | Huben et al. | |
| 2009/0064071 A1 | 3/2009 | Siarkowski et al. | |
| 2010/0153924 A1 | 6/2010 | Andrews | |
| 2012/0203535 A1 | 8/2012 | Arbel et al. | |
| 2013/0019216 A1 | 1/2013 | Vasudevan et al. | |
| 2013/0019217 A1* | 1/2013 | Brinkmann | 716/106 |
| 2013/0060545 A1 | 3/2013 | Chockler et al. | |

OTHER PUBLICATIONS

U.S. Appl. No. 13/874,388, filed Apr. 30, 2013.

U.S. Appl. No. 12/797,476, filed Jun. 9, 2010.

Chang, C. Michael. "Property specification: the key to an assertion-based verification platform." (2003).

Richards, Joseph. "Creative assertion and constraint methods for formal design verification." Proceedings of DVCon (2003).

Bailey, B. et al., "Combining Metrics from Simulation and Formal," Jasper Design Automation, Aug. 5, 2008, two pages, Tech Pro Communications. [Online] [Retrieved Jan. 7, 2014] Retrieved from the Internet <URL: http://www.soccentral.com/results.asp?entryiD=26340#PrintPage.>.

Chockler, H. et al., "Coverage Metrics for Formal Verification," Correct Hardware Design and Verification Methods, Proceedings of the 1ih IFIP WG 10.5 Advanced Research Working Conference, CHARME 2003, Oct. 21-24, 2003, pp. 111-125, L'Aquila, Italy.

Chockler, H. et al., "Coverage Metrics for Temporal Logic Model Checking," Tools and Algorithms for the Construction and Analysis of Systems, Proceedings of the fh International Conference, TACAS 2001, Apr. 2-6, 2001, pp. 528-542, vol. 2031, Genova, Italy.

Claessen, K., "A Coverage Analysis for Safety Property Lists," Proceedings of Seventh International Conference on Formal Methods in Computer-Aided Design, FMCAD 2007, Nov. 11-14, 2007, pp. 139-145, Austin, Texas, USA.

Dershowitz, N. et al., "A Scalable Algorithm for Minimal Unsatisfiable Core Extraction," Proceedings of SAT2006, pp. 36-41, vol. 4121.

Ho, R. et al., "What can be expected from the Accellera Unified Coverage Interoperability Standard?," Electronic Design Europe, Oct. 22, 2010, seven pages. [Online] [Retrieved Jan. 13, 2014] Retrieved from the Internet <URL: http://electronicdesign.com/displays/what-can-be-expected-accellera-unifiedcovera!=) e-interoperabil ity-standard. >.

Hoskote, Y. et al., "Coverage Estimation for Symbolic Model Checking," Proceedings of the 36th Annual ACMIIEEE Design Automation Conference (DAC '99), 1999, pp. 300-305.

Liu, C.-N. et al., "Efficient coverage analysis metric for HDL design validation," Proceedings of IEE International Conference on Computers and Digital Techniques, Jan. 2001, pp. 1-6, vol. 148, No. 1.

Non-Final Office Action dated Mar. 3, 2015 for U.S. Appl. No. 14/474,280.

Non-Final Office Action dated Nov. 21, 2013 for U.S. Appl. No. 13/826,801.

Notice of Allowance dated Apr. 14, 2014 for U.S. Appl. No. 13/826,801.

Piziali, A., "Functional Verification Coverage Measurement and Analysis," 2004, two hundred thirteen pages, Kluwer Academic Publishers, Massachusetts, USA.

Ranjan, R. et al., "Understanding coverage with multiple verification methods," Jasper Design Automation, Nov. 28, 2007, six pages, Tech Source Media, Inc. [Online] [Retrieved Jan. 7, 2014] Retrieved from the Internet <URL: http://jasper-da.com/sites/default/files/pdfs/Understanding_coverage_multiple_verification methods Nov2007.pdf.

Ranjan, R., "We need a simpler and faster approach to formal verification," Jasper Design Automation, EE Times, Jul. 30, 2012, four pages. [Online] [Retrieved Jan. 7, 2014] Retrieved from the Internet <URL: http://www.eetimes.com/author.asp?section id=36&doc id=1287752.>.

Springsoft, "Certitude Functional Qualification System," Apr. 3, 2012, three pages. [Online] [Retrieved Jan. 7, 2014] Retrieved from the Internet <URL: https://web.archive.org/web/20120403191715/http:/www.sprin!=)soft.com/products/functional-qualification/certitude.>.

Notice of Allowance dated Jun. 25, 2015 for U.S. Appl. No. 14/474,280.

* cited by examiner

```
135:   always @(posedge clk) begin
136:       if (rst) begin
137:           q1 <= 1'b0;
138:           q2 <= 1'b0;
139:       end else begin
140:           if ((a & b) | c) begin
141:               q1 <= 1'b1;
142:           end
143:           if (a & b) begin
144:               q2 <= 1'b1;
145:           end
146:       end
```

```
Property verification bound k................................................ 137 cycles Relevant cover Items [COI]................................................... 1200 items
Relevant cover items reached [COI_R]................................. 1105 items
Relevant cover items reached within bound k [COI_R(k)]............ 865 items
Unreachable cover items [COI_U]......................................... 55 items
Undetermined cover items [COI_B]........................................ 40 items Verification coverage ......................................................... 76%
```

Perform FV on circuit design against property to bound k
602

Compute coverage metric
604

Compute coverage metrics
612

Generate coverage graph
614

FORMAL VERIFICATION COVERAGE METRICS OF COVERED EVENTS FOR CIRCUIT DESIGN PROPERTIES

BACKGROUND

1. Field of the Disclosure

This disclosure relates generally to formal verification of circuit designs, and more specifically to formal verification coverage metrics for formal verification of circuit designs.

2. Description of Related Art

Over the last 30 years, the complexity of integrated circuits has increased greatly. This increase in complexity has exacerbated the difficulty of verifying circuit designs. In a typical integrated circuit design process, which includes many steps, the verification step consumes approximately 70-80% of the total time and resources. Aspects of the circuit design such as time-to-market and profit margin greatly depend on the verification step. As a result, flaws in the design that are not found during the verification step can have significant economic impact by increasing time-to-market and reducing profit margins.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation. RTL describes the registers of a computer or digital electronic system and the way in which data are transferred among them.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical design tools to create a HDL-based design.

In the design flow, creation of the RTL source code is followed by verification of the design to check if the RTL source code meets various design specifications. Formal verification is one such technique for verifying the circuit design. Formal verification uses mathematical techniques to prove that, under a set of constraints, a design property is either always true or to provide an example condition (called a counterexample) that demonstrates the property is false. Tools that use formal methods to verify RTL source code and design properties are known as "model checkers." Design properties to be verified include specifications and/or requirements that must be satisfied by the circuit design. Since mathematical properties define the design requirements in pure mathematical terms, this enables analysis of all possible valid inputs for a given circuit and is akin to an exhaustive simulation.

Due to mathematically complex nature of formal analysis, it is possible that the computation may hit resource limits, such as time and available memory. An incomplete formal analysis can be measured in terms of number of cycles the analysis of the design has gone through. When formal analysis is incomplete, it is useful to know how much of the possible reachable state space has been covered during the formal verification before the resource limit was reached. However, establishing that measure is not practical since determining the exact reachable state space is itself a hard problem.

SUMMARY

To improve the quality of formal verification coverage metrics for circuit designs, embodiments of the present disclosure use information about reachable and unreachable cover items in generating coverage information when formal analysis is incomplete.

In one embodiment, a computer-implemented method for circuit design verification is disclosed. The method comprises receiving a property defined for a circuit design, the property having a cone of influence in the circuit design corresponding to a portion of the circuit design capable of affecting the property. Reachability analysis is performed for the circuit design against a set of cover items. The set of cover items are classified into classified cover items based on results of the reachability analysis. Coverage information is generated indicating an amount of formal verification coverage provided by the property. The coverage information is generated based on a set of the classified cover items that correspond to the cone of influence of the property and that are reached within a particular bound during the reachability analysis. For example, the bound may be the bound that was reached during formal verification of the circuit design against the property.

The coverage information generated using the disclosed method accurately represents the level of formal verification coverage associated with incomplete formal analysis of a property. The coverage information can be generated using any one of a number of types of cover items. The coverage information can be a coverage metric or a coverage graph. The coverage information can also be presented on a display to a circuit designer that can determine whether the property should be verified to a greater bound.

In one embodiment, disclosed is a non-transitory computer readable medium storing code for circuit design verification. The code is executable by a processor for performing the method.

BRIEF DESCRIPTION OF THE DRAWINGS

The teachings of the embodiments of the present disclosure can be readily understood by considering the following detailed description in conjunction with the accompanying drawings.

DETAILED DESCRIPTION OF THE PREFERRED EMBODIMENTS

The Figures (FIG.) and the following description relate to preferred embodiments of the present disclosure by way of illustration only. Reference will now be made in detail to several embodiments of the present disclosure(s), examples of which are illustrated in the accompanying figures. It is noted that wherever practicable, similar or like reference numbers may be used in the figures and may indicate similar or like functionality. One skilled in the art will readily recognize from the following description that alternative embodiments of the structures and methods illustrated herein may be employed without departing from the principles of the disclosure described herein.

Embodiments of the present disclosure describe a formal verification system that generates formal verification coverage information for a circuit design. The coverage information describes an amount of verification coverage provided by formally verifying a property to a particular bound. The coverage information is generated from cover items and is a approximation for knowing exactly how much state space has been explored. The coverage information is presented to a circuit designer, who can then determine whether the coverage is sufficient or should be increased by verifying the property to a higher bound.

Figure 1:
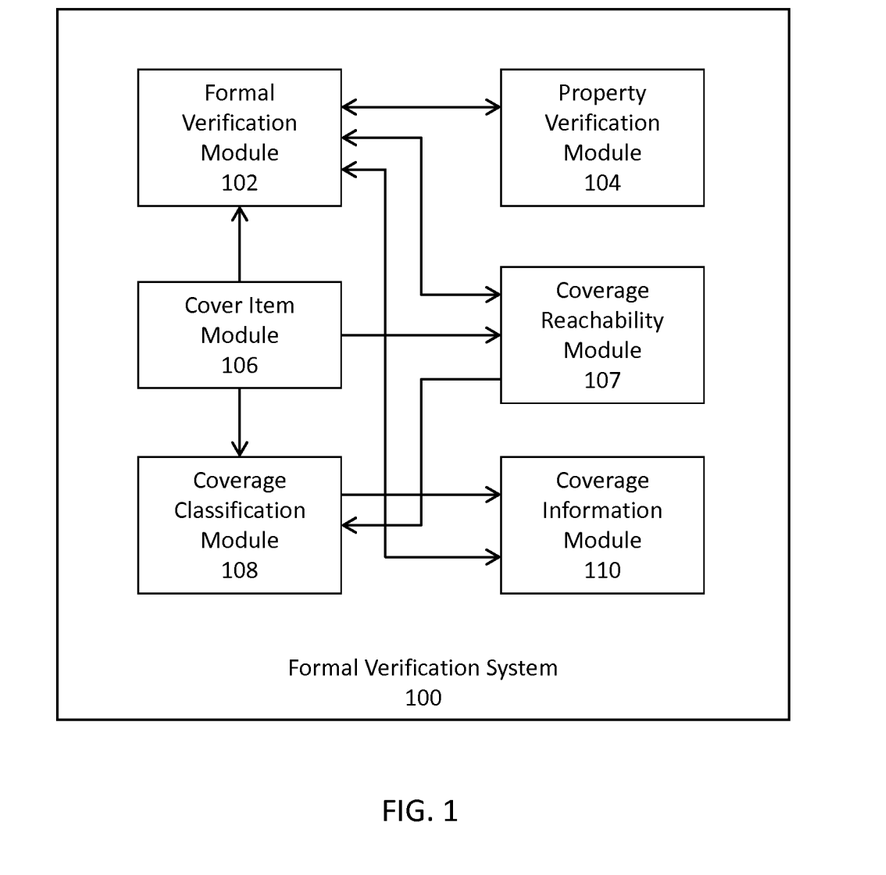
FIG. 1 is a formal verification system for evaluating formal verification coverage of a circuit design, according to an embodiment.

FIG. 1 is a formal verification system 100 for evaluating formal verification coverage of a circuit design, according to an embodiment. As shown, formal verification system 100 includes a formal verification module 102, a property verification module 104, a cover item module 106, a coverage reachability module 107, a coverage classification module 108 and a coverage information module 110. In one embodiment, the formal verification system 100 may be a computer and the modules are processor executable software instructions stored on a non-transitory computer readable medium of the computer.

Formal verification module 102 receives a circuit model of a circuit design, a verification environment, and verification targets and uses formal verification techniques to verify the correctness of the circuit design with respect to the verification targets. The circuit model may be a RTL description of the circuit design written in HDL or other appropriate language. The verification environment can include reset conditions, assumptions, clock definitions, and other information constraining the scope of the formal verification. Verification targets can include properties describing a behavioral relationship between signals of the circuit design that is to be verified during formal verification. The formal verification is carried out by checking whether the mathematical state of the design (e.g., a labeled state-transition graph) satisfies the verification targets. The formal verification can use bounded model checking (BMC) or other appropriate techniques for formal verification.

In one embodiment, verification targets may be assertion properties and the formal verification can prove whether an assertion property is always true or to provide an example condition (called a counterexample) that demonstrates the property is false. In another embodiment, the properties can be cover items and the formal verification module 102 is used to perform reachability analysis to determine whether cover items can be reached. Due to the complex nature of formal analysis, formal verification may hit a resource limit, such as a time or memory limit, before being able to conclusively determine whether the properties can be satisfied. This limit is referred to as a bound, and the bound can be measured in terms of number of verification cycles that the design has gone through. For example, a bound of "k" cycles establishes that the circuit design has been analyzed for all input sequences of length k.

Property verification module 104 receives one or more assertion properties and interacts with the formal verification module 102 in an attempt to prove whether the assertion properties are always true. The properties are described in an assertion based verification language, such as System Verilog Assertion (SVA) or Property Specification Language (PSL). The properties may be in a stand-alone file or embedded into a description of the circuit design. An example of an assertion property is "x|→y" (in SVA syntax), which means that whenever signal x is asserted, signal y should also be asserted in the same clock cycle.

Formal verification of an assertion property may (1) prove that the property is always true (2) prove that the property is not always true and produce a counterexample or (3) be unable to prove whether the property is always true or not by the time a bound k reached. When a property cannot be proven true and cannot proven false by bound k, questions arise as to whether bound k is sufficient for covering most of the state space of circuit design, and whether bound k should be increased to cover portions of the state space that have not yet been tested. Embodiments of the present disclosure generate coverage information indicating how much of the reachable state space is covered during formal verification through the use of cover items, as will be described herein.

Cover item module 106 determines cover items for coverage testing. Cover items represent aspects/events of the circuit design that may or may not be exercised during verification of the circuit design. Cover items are used as a proxy for the state space of a circuit design. If more cover items are triggered during verification, it indicates that verification of a property provides a high level of coverage (i.e. the verification exercised most of the cover items, therefore most of the state space was probably reached). If fewer cover items are triggered during verification, it indicates that verification of a property provides a low level of coverage.

In one embodiment, the cover item module 106 determines the cover items according to a coverage model that specifies one or more types of cover items to be used during reachability analysis. Different types cover items can include code cover items, finite state machine (FSM) cover items, functional point cover items, or toggle cover items, among others. In other embodiments, the cover reachability module 106 determines the cover items by receiving a pre-determined collection of cover items. These different types of cover items are now explained in greater detail.

Figure 2:
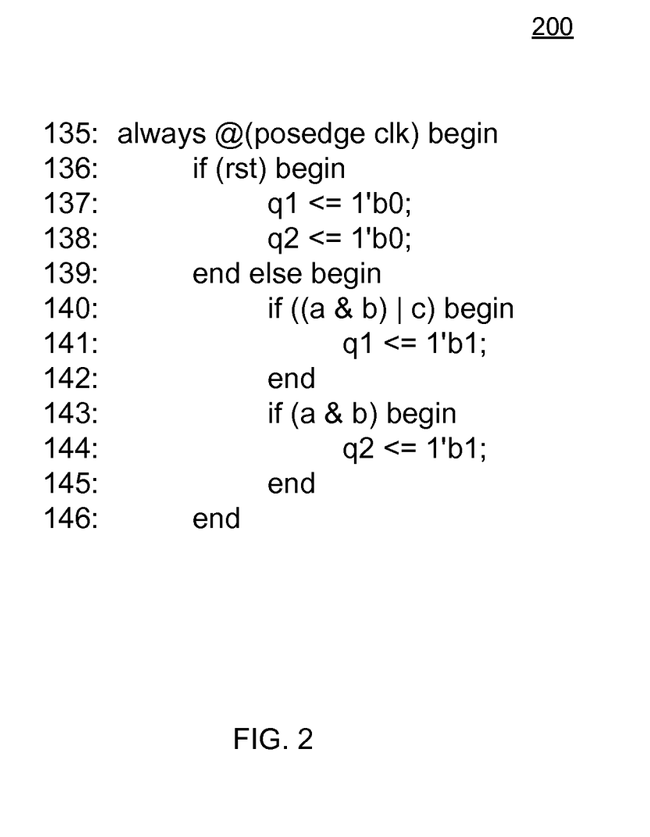
FIG. 2 is a RTL description of a circuit design, according to an embodiment.

Referring to FIG. 2, illustrated is a RTL description 200 of a circuit design for explaining code cover items, according to an embodiment. The RTL description 200 includes several lines of RTL code describing a portion of a circuit design. Code cover items are cover items generated from the RTL code. The coverage of code coverage items provides an indication of how much of the RTL code is exercised during formal verification. The following are examples of code cover items:

Statement cover items—Statement cover items are lines of RTL code that assign a value to a signal. For example, lines 137, 138, 141, and 144 are statement cover items.

Expression cover items—Expression cover items are cover items generated from logical expressions in the RTL code. For example, the expression "a & b" from line 143 of the RTL code can be used to generate four cover items of a=1/b=1, a=0/b=1, a=1/b=0, a=0/b=0.

Branch cover items—Branch coverage items are cover items generated from branching locations in the RTL code. For example, lines 136, 139, 140 and 143 are branching locations in the RTL code. Branch cover items can be generated from the branching locations that test for whether a particular branch is taken.

Condition cover items—Condition cover items are cover items generated from conditional statements in the RTL code. For example, two cover items of rst=0 and rst=1 can be generated from the "if" statement in line 136.

A FSM cover item describes states and transitions of a finite state machine in the circuit design. For example, a signal F in the circuit design may have three possible states A, B, C with possible transitions of A→B, A→C, B→C and C→A. Possible FSM state cover items can be the states of F=A, F=B, and F=C. Possible FSM transition cover items can be transitions of A→B, A→C, B→C and C→A.

A functional point cover item describes a functional event involving different portions of a circuit design. For example, the statement "a&b ##1 c" written in the SVA language is a functional point cover item. This statement captures the event when a&b is a logical 1 in one clock cycle and c is logical 1 in the next clock cycle.

A toggle cover item describes an event involving values of a signal across different clock cycles. For example, for a signal q1, a cover item may be the statement "q1=1 ##1 q1=0." This statement means that when q1 is logic 1 in one clock cycle, q1 is logic 0 in the next clock cycle.

Figure 3:
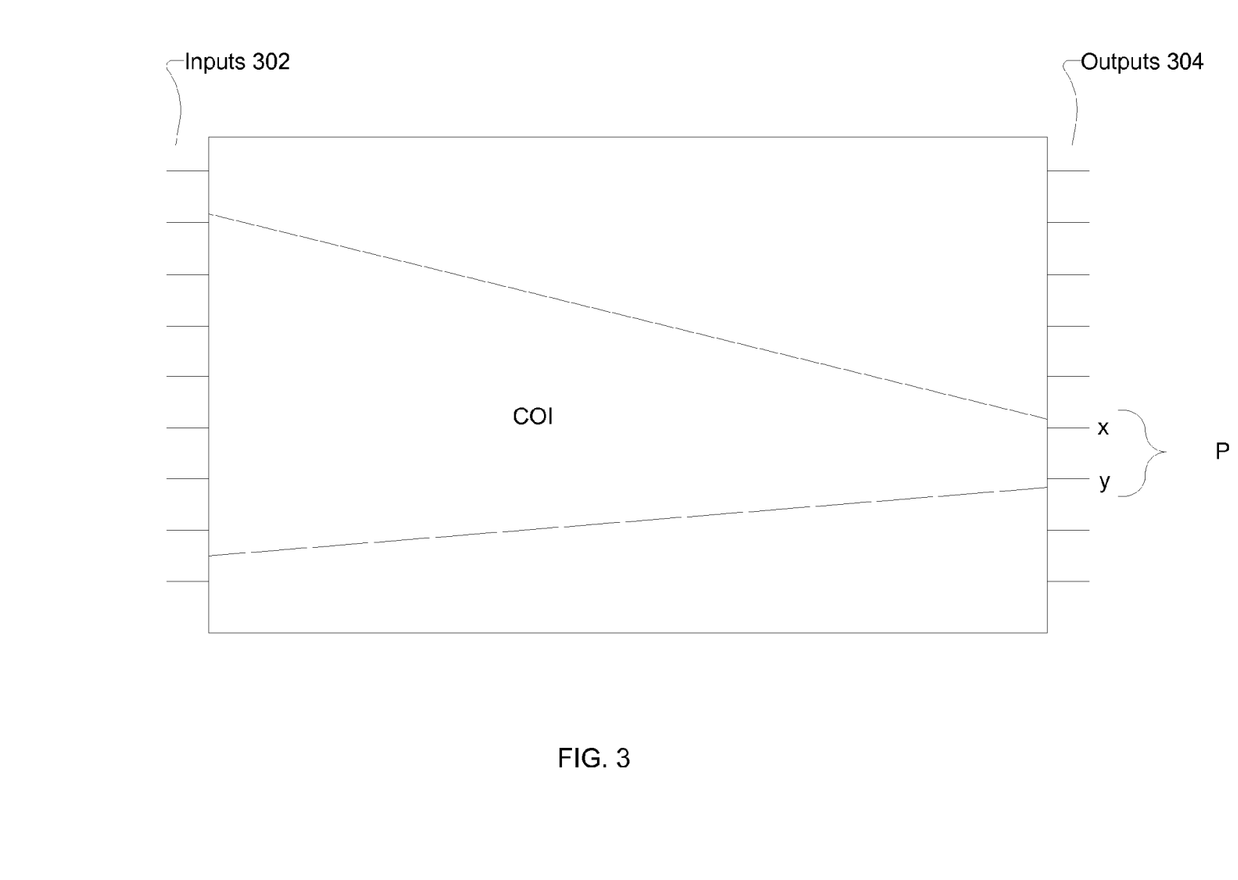
FIG. 3 is a circuit design and a property with a cone of influence within the circuit design, according to an embodiment.

Once the cover items are determined, the cover item module 106 identifies a set of the cover items that are relevant to a property. Only some of the cover items are typically relevant to a given property, and whether a cover item is relevant to a property depends on the relationship between a cover item and the cone of influence (COI) of the property within the circuit design. Referring to FIG. 3, illustrated is a circuit design and an assertion property with a COI in the circuit design, according to an embodiment. The circuit design includes a set of signal inputs 302 on the left of the circuit design. The circuit design includes a set of signal outputs 304 on the right side of the circuit design. The signal outputs include the signals of "x" and "y". An assertion property P defined for the circuit design is "x|→y" which means that whenever x is asserted, y must also be asserted in the same clock cycle. The COI of property P represents a portion of the circuit design that is capable of affecting the signals of property P. The COI thus includes components of the circuit design that directly drive signals x and y, as well as all other signals/components located along signal paths between the inputs 302 of the circuit design and the fan-in of those components. Portions of the circuit design outside of the COI are not capable of affecting the values of signals x and y.

A code cover item is considered to be relevant to a property if the code cover item can be mapped to components or signals within the COI of a property. For example, a code statement of "q1<=1'b0" is relevant to a given property if the signal q1 is within the COI of that property. Similarly, a FSM cover item, functional cover item, or toggle cover item is relevant to a given property if the cover item includes at least one signal that is within the COI of a property. For example, the functional coverage point of "a&b ##1 c" is relevant to a property if either signal a, b or c is within the COI of the property. In other embodiments, a cover point is relevant to a property if the COI of the cover point overlaps with a COI of the property.

The coverage reachability module 107 interacts with the formal verification module 102 to perform reachability analysis on the set of cover items that are in the COI of the property. The reachability analysis uses formal verification to explore the state space of the circuit design in an attempt to reach the cover items in the set of cover items within a bound m. Cover items are reached when the condition specified by a cover item is triggered/found in the state space of the circuit design. Bound m used for coverage reachability analysis may be different than the bound k used during formal verification of the property. Additionally, the bound m may be pre-determined or the result of a circuit designer deciding to halt the reachability analysis due to time or memory constraints. With the arrangement in most model checking algorithms, a coverage reachability analysis would determine the smallest bound s in which a cover item can be reachable, which means the cover item can be marked as reachable within bound m for any m greater or equal to s.

When bound m is reached, the reachability analysis produces a result for each cover item describing whether the cover item was reachable within bound m, was not reachable within bound m, or is proven to be unreachable. The result may also include other information, such as the specific bound when a cover item was first reached.

The coverage classification module 108 classifies the cover items into classified cover items using the results of the reachability analysis. In one embodiment, the cover items are placed into three categories, referred to as COI_R, COI_U, and COI_B. COI_R includes those cover items that were reachable within the bound m. COI_U includes those cover items that are determined to be unreachable, regardless of how large the bound m is. COI_B includes those cover items that are unreachable within the bound m, but may be reachable if the bound m is increased. In one embodiment, cover items that are reachable within the bound m may be classified according to how long it took before the cover items were reached. For example, cover items reached by a bound of 2 cycles may be labeled as such, and cover items reached by a bound of 5 cycles may be labeled as such.

The coverage information module 110 generates coverage information from the classified cover items and presents this coverage information to a circuit designer. The coverage information provides an indication of an amount of verification coverage provided by formally verifying a property to a particular bound(s). Different types of coverage information can be generated from the classified cover items, such as coverage metrics and coverage graphs, as will be explained in greater detail.

In one embodiment, the coverage information can be a coverage metric, such as a percentage or a number. The coverage metric can be calculated with the following formula:

$$\text{coverage} = \frac{\#COI\_R(k)}{\#COI\_T - \#COI\_U} \times 100\% \quad \text{(equation 1)}$$

where k is the bound reached during formal verification of a property. #COI_R(k) is the number of cover items in COI_R that are reachable within bound k. #COI_T is the total number of cover items in the COI of the property. #COI_U is the number of cover items that are proven unreachable during the reachability analysis. In other words, the coverage metric produced by equation 1 is a ratio of cover items reachable within bound k to all cover items that can possibly be reached for any value of the bound (e.g. up to infinite bound).

The coverage metric of equation 1 thus represents the amount of verification coverage provided by verifying the property to a bound k. A high coverage metric (e.g. approaching 100 percent) indicates that most of the cover items were reachable within bound k, which implies that most of the state space for triggering these cover items was explored. A low coverage metric (e.g., approaching 0 percent) indicates that very few of the cover items were reachable within bound k, which implies that the property analysis is shallow and the property should be verified to a larger bound. The coverage metric of equation 1 can be viewed as a confidence score, where higher numbers are indicative of a higher level of verification confidence.

Figure 4A:
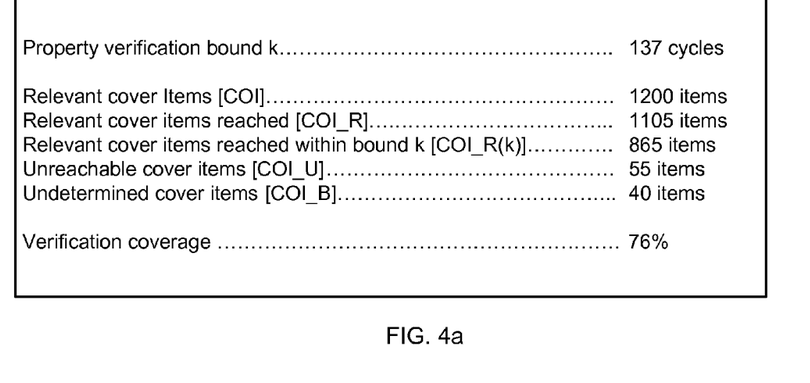
FIG. 4A is a user interface that includes a coverage metric, according to an embodiment.

Referring to FIG. 4A, illustrated is a user interface that includes a coverage metric, according to an embodiment. This interface shows that a property was verified to a bound k of 137 cycles. There are a total of 1200 cover items in the COI of the property. COI_R includes 1105 cover items that were reached during the reachability analysis. COI_R(k) includes 865 cover items that were reached within bound k during reachability analysis. COI_U includes 55 cover items that were proven unreachable during the reachability analysis. COI_B includes 40 cover items that were not reached by bound m during the reachability analysis, but may be reachable at higher bounds. The verification coverage metric is 76%. The metric is computed as 865 divided by [1200−55]. The verification coverage metric informs the circuit designer that 76% of cover items that can be reached were actually reached when verifying the property to bound k. This metric also informs the circuit designer that there is room for improvement by increasing the verification bound.

In equation 1, the cover items in COI_U are subtracted from COI_T to produce the denominator of equation 1. This is because the cover items in COI_U are unreachable regardless of whether the bound is increased. Including these cover items in the metric would result in a coverage metric that can never reach 100%, which is undesirable.

In other embodiments, the coverage information module 110 may compute more than one coverage metric. For example, one metric can be computed for bound k and another metric can be computed for bound greater than k (e.g. k+1). Alternatively, a differential coverage metric can be computed as the difference between the coverage metric for bound k and coverage metric for a bound greater than k. These metrics generally inform the circuit designer of whether increasing the bound would be beneficial for increasing verification coverage.

In a further embodiment, coverage metrics for different bounds or bound ranges can be computed and then used to generate a coverage graph. The coverage graph plots coverage metrics against different bounds to indicate how the verification coverage changes across different bounds. Different coverage graphs are shown in FIGS. 4B and 4C.

Figure 4B:
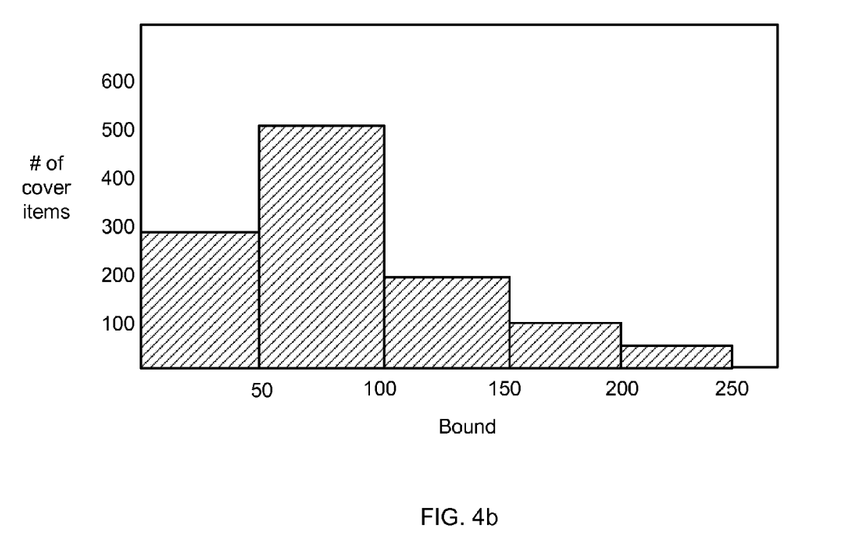
FIG. 4B is a user interface that includes a coverage graph, according to an embodiment.

Referring to FIG. 4B, illustrated is user interface that includes a histogram coverage graph, according to an embodiment. The coverage graph is a histogram showing a distribution of when cover items are reached across different bounds. The x axis of the graph is the verification bound. The y axis is the number of cover items reached. The graph shows that 300 cover items are first reached between bounds 1-50, 500 cover items are first reached between bounds 51-100, 200 cover items are first reached between bounds 101-150, 100 cover items are first reached between bounds 151-200, and 50 cover items are first reached between bounds 200-250.

The graph provides a circuit designer with an understanding of how verification coverage can be improved by increasing the bound k. For example, a circuit designer viewing the graph can quickly make a cost-benefit determination as to whether it makes sense to increase the verification bound k from 100→150 cycles.

Figure 4C:
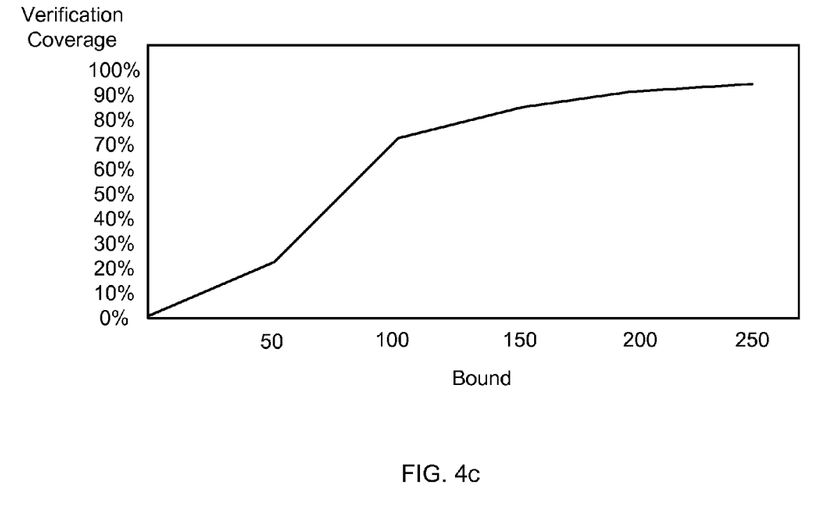
FIG. 4C is a user interface that includes a coverage graph, according to another embodiment.

FIG. 4C illustrates a user interface that includes a coverage graph, according to another embodiment. The coverage graph is a line or graph showing how verification coverage increases as the bound increases. The x axis of the graph is the verification bound. The Y axis is the verification coverage percentage. The coverage graph is cumulative such that the verification coverage increases as the bound increases.

Figure 5:
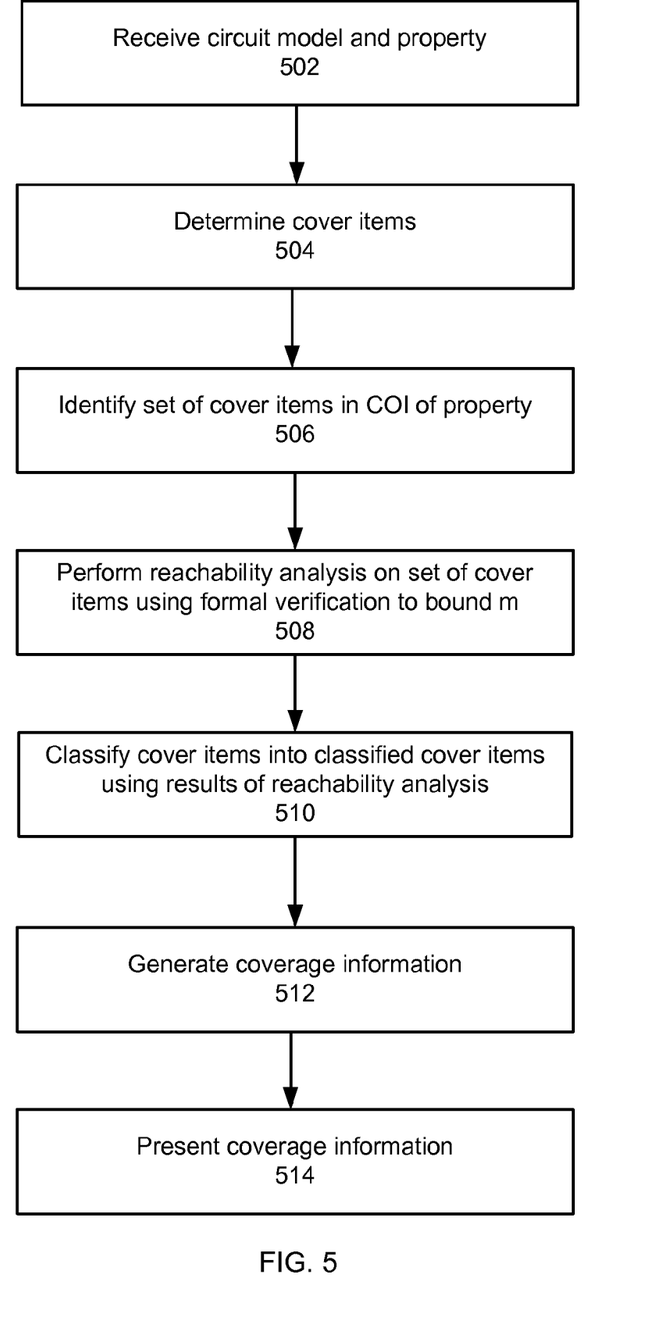
FIG. 5 is a flowchart of a method for evaluating formal verification coverage of a circuit design, according to an embodiment.

FIG. 5 is a flowchart of a method for evaluating formal verification coverage of a circuit design, according to an embodiment. In step 502, a circuit model of a circuit design and a property (e.g. assertion property) defined for the circuit design are received. The property has a COI in the circuit design corresponding to a portion of the circuit design capable of affecting the property.

In step 504, cover items are determined for verification depending on a type of coverage model (e.g. code coverage, FSM coverage) that is selected for verification. In step 506, a set of the cover items that is in the COI of the property are identified. In embodiments where there are multiple properties, the set of cover items includes those cover items that are in the combined COI of the properties.

In step 508, reachability analysis is performed on the set of cover items using formal verification techniques in an attempt to reach the cover items. The reachability analysis is bounded and is only performed up to a bound m. In step 510, the cover items are classified into classified cover items using the results of the reachability analysis.

In step 512, coverage information indicating an amount of formal verification coverage provided by the property is generated from the classified cover items. The coverage information is generated by identifying a set of the classified cover items that are reached by a certain bound (e.g. k or other bound) during the reachability analysis and using that set of classified cover items to generate the coverage information. Because the classified cover items only include cover items in the COI of the property, the set of classified cover items represent only those cover items that correspond to the COI of the property and are also reached by a certain bound. Different embodiments of step 512 will be explained in greater detail by reference to FIGS. 6A and 6B. In step 514, the coverage information is presented to a circuit designer for analysis.

Figure 6A:
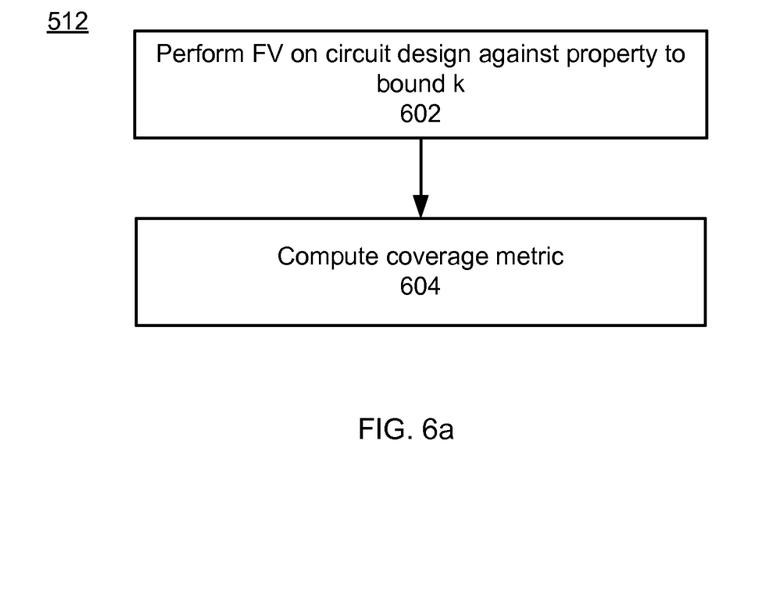
FIG. 6A is a flowchart of a method for the step of generating coverage information from FIG. 5 in more detail, according to an embodiment.

FIG. 6A is a flowchart of a method for the step 512 of generating coverage information from FIG. 5 in more detail, according to an embodiment. In step 602, formal verification is performed on a circuit design against the property to prove a truth of the property. The formal verification reaches bound k without being able to prove whether the property is true or not. In step 604, a coverage metric is computed, for example, using equation 1 and as shown in FIG. 4A. The coverage metric indicates the amount of verification coverage provided by verifying the property to the bound k.

Figure 6B:
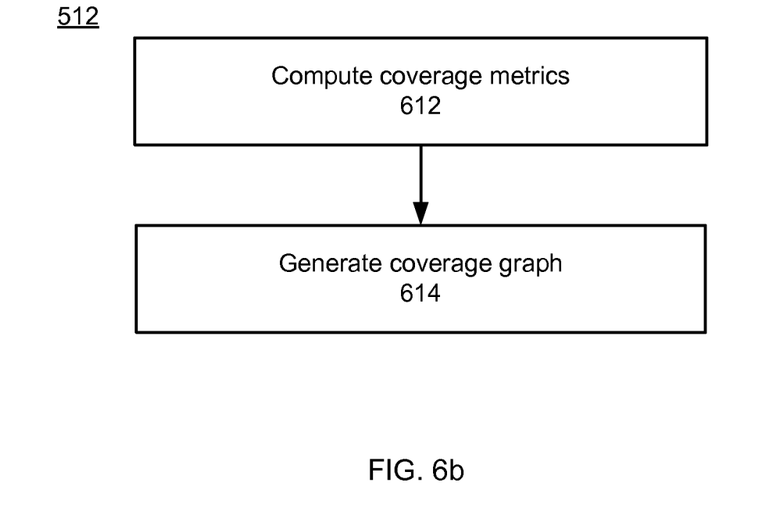
FIG. 6B is a flowchart of a method for the step of generating coverage information from FIG. 5 in more detail, according to another embodiment.

FIG. 6B is a flowchart of a method for the step 512 of generating coverage information from FIG. 5 in more detail, according to another embodiment. In step 612, different coverage metrics are computed for the circuit design. The coverage metrics are then used to generate a coverage graph 614 that visualizes coverage across different verification bounds. For example, the coverage graph can be the graphs shown in FIG. 4B or 4C.

Referring back to FIG. 5, in another embodiment, in some embodiments step 506 may be excluded such that all of the cover items are used during the reachability analysis. After the reachability analysis is completed, the resulting classified cover items are then filtered to remove cover items that are outside of the COI while retaining those cover items in the COI. However this embodiment may be slower because it requires performing reachability analysis on a larger set of cover items.

In one embodiment, the cover items may not be used to generate 512 coverage information or to present 514 coverage information. Instead, the unreachable cover items COI_U can be converted into helper assertions. Helper assertions are constraints on signals in the circuit design. The property can then be formally verified using the helper assertions as additional inputs to the formal verification. Helper assertions help speed up the verification of a property since it reduces the state space about how the design can behave, and so the formal analysis does not have to analyze as many scenarios. For example, when a functional coverage point "a && b" has been found to be unreachable, a helper assertion with the expression "! (a && b)" can be added to speed up the verification of a property.

In a further embodiment, the formal verification system 100 may receive a target coverage level (e.g. 80%) from a user that represents an amount of formal verification coverage that the user desires. Coverage metrics may be measured on multiple bounds with respect to a property. A particular coverage metric is identified that achieves the target coverage level. For example, the coverage metrics can be analyzed to determine a coverage metric that matches or exceeds the target coverage level. The circuit design is then formally verified against the property until a target bound associated with the identified coverage metric is reached. Once the target bound is reached, the formal verification is automatically halted.

Embodiments of the present disclosure thus describe a formal verification system that generates formal verification coverage information for a circuit design. The coverage information describes an amount of verification coverage provided by formally verifying a property to a particular bound. The coverage information is generated from cover items and is a substitute for knowing exactly how much state space has been explored. The coverage information is presented to a circuit designer, who can then determine whether the coverage is sufficient or should be increased by verifying the property to a higher bound.

The foregoing description of the embodiments of the disclosure has been presented for the purpose of illustration; it is not intended to be exhaustive or to limit the embodiments to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a non-transitory computer-readable medium containing computer program code, which can be executed by one or more computer processors for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A computer-implemented method for circuit design verification, comprising:
    performing a process using at least one processor of a computing system, the process comprising:
    receiving a property defined for a circuit design, the property having a cone of influence in the circuit design corresponding to a portion of the circuit design capable of affecting the property;
    performing reachability analysis for the circuit design against a set of cover items through a coverage reachability module coupled with the at least one processor of the computing system;
    classifying the set of cover items into multiple groups of classified cover items based on results of the reachability analysis through a coverage classification module coupled with the coverage reachability module; and
    generating a coverage graph indicating an amount of formal verification coverage provided by the property based on a first set of the classified cover items through a coverage information mechanism coupled with the coverage classification module, wherein
    the classified cover items in the first set correspond to the cone of influence of the property and are reached within a bound during the reachability analysis, and
    the coverage graph indicates one or more changes of the classified cover items across a plurality of bounds.

2. The computer-implemented method of claim 1, wherein generating the coverage information further comprises:
    generating a coverage metric indicating an amount of formal verification coverage provided by the property based on a first number of the first set of the classified cover items that correspond to the cone of influence of the property and that are reached within the bound during the reachability analysis.

3. The computer-implemented method of claim 2, wherein the coverage metric is further generated based on second number, the second number indicative of a difference between a second set of classified cover items that correspond to the cone of influence of the property and a third set of the classified cover items that correspond to the cone of influence of the property and that are proven unreachable during the reachability analysis.

4. The computer-implemented method of claim 3, wherein the coverage metric is based on a ratio of the first number to the second number.

5. The computer-implemented method of claim 4, wherein generating the coverage information further comprises:
 generating a coverage graph based on at least the coverage metric, the coverage graph indicating changes in coverage of the classified cover items across a plurality of bounds.

6. The computer-implemented method of claim 2, wherein the coverage metric indicates an amount of improvement in the formal verification coverage provided by the property if the bound is increased.

7. The computer-implemented method of claim 1, further comprising:
 performing formal verification of the circuit design against the property up to the bound, the formal verification unable to prove or disprove the truth of the property by the bound,
 wherein generating the coverage information comprises generating the coverage information responsive to performing the formal verification against the property up to the bound.

8. The computer-implemented method of claim 7, wherein generating the coverage information responsive to performing the formal verification against the property up to the bound comprises:
 determining a first number of the first set of the classified cover items that correspond to the cone of influence of the property and that are reached within the bound during the reachability analysis;
 determining a second number indicative of a difference between a second set of classified cover items that correspond to the cone of influence of the property and a third set of the classified cover items that correspond to the cone of influence of the property and that are proven unreachable during the reachability analysis; and
 generating a coverage metric indicating an amount of formal verification coverage provided by the property based on a ratio of the first number to the second number.

9. The computer-implemented method of claim 1, further comprising:
 determining a plurality of cover items; and
 identifying the set of cover items from the plurality of cover items, each cover item in the set of cover items corresponding to the cone of influence of the property,
 wherein the reachability analysis is performed on the set of cover items responsive to identifying the set of cover items.

10. The computer-implemented method of claim 1, further comprising:
 receiving a target level of formal verification coverage from a user;
 identifying, from the coverage information, a coverage metric that achieves the target level of formal verification coverage; and
 performing formal verification of the circuit design against the property and halting the formal verification when a target bound associated with the coverage metric is reached.

11. A non-transitory computer readable medium storing code for circuit design verification, the code executable by a processor for:
 receiving a property defined for a circuit design, the property having a cone of influence in the circuit design corresponding to a portion of the circuit design capable of affecting the property;
 performing reachability analysis for the circuit design against a set of cover items through a coverage reachability module coupled with the at least one processor of the computing system;
 classifying the set of cover items into multiple groups of classified cover items based on results of the reachability analysis through a coverage classification module coupled with the coverage reachability module; and
 generating a coverage graph indicating an amount of formal verification coverage provided by the property based on a first set of the classified cover items through a coverage information mechanism coupled with the coverage classification module, wherein
  the classified cover items in the first set correspond to the cone of influence of the property and are reached within a bound during the reachability analysis, and
  the coverage graph indicates one or more changes of the classified cover items across a plurality of bounds.

12. The computer readable medium of claim 11, wherein generating the coverage information further comprises:
 generating a coverage metric indicating an amount of formal verification coverage provided by the property based on a first number of the first set of the classified cover items that correspond to the cone of influence of the property and that are reached within the bound during the reachability analysis.

13. The computer readable medium of claim 12, wherein the coverage metric is further generated based on second number, the second number indicative of a difference between a second set of classified cover items that correspond to the cone of influence of the property and a third set of the classified cover items that correspond to the cone of influence of the property and that are proven unreachable during the reachability analysis.

14. The computer readable medium of claim 13, wherein the coverage metric is based on a ratio of the first number to the second number.

15. The computer readable medium of claim 14, wherein generating the coverage information further comprises:
 generating a coverage graph based on at least the coverage metric, the coverage graph indicating changes in coverage of the classified cover items across a plurality of bounds.

16. The computer readable medium of claim 12, wherein the coverage metric indicates an amount of improvement in the formal verification coverage provided by the property if the bound is increased.

17. The computer readable medium of claim 11, the code further executable by the processor for:
 performing formal verification of the circuit design against the property up to the bound, the formal verification unable to prove or disprove the truth of the property by the bound, wherein
  generating the coverage information comprises generating the coverage information responsive to performing the formal verification against the property up to the bound.

18. The computer readable medium of claim 17, wherein generating the coverage information responsive to performing the formal verification against the property up to the bound comprises:
 determining a first number of the first set of the classified cover items that correspond to the cone of influence of the property and that are reached within the bound during the reachability analysis;

determining a second number indicative of a difference between a second set of classified cover items that correspond to the cone of influence of the property and a third set of the classified cover items that correspond to the cone of influence of the property and that are proven unreachable during the reachability analysis; and generating a coverage metric indicating an amount of formal verification coverage provided by the property based on a ratio of the first number to the second number.

19. The computer readable medium of claim 11, the code further executable by the processor for:

determining a plurality of cover items; and identifying the set of cover items from the plurality of cover items, each cover item in the set of cover items corresponding to the cone of influence of the property, wherein the reachability analysis is performed on the set of cover items responsive to identifying the set of cover items.

20. A system for circuit design verification, comprising:

a non-transitory computer readable storing thereupon computer code;

a computing system comprising the at least one processor that executes the computer code to:

receive a property defined for a circuit design, the property having a cone of influence in the circuit design corresponding to a portion of the circuit design capable of affecting the property;

perform reachability analysis for the circuit design against a set of cover items with a coverage reachability module that is coupled with the at least one processor of the computing system;

classify the set of cover items into classified cover items based on results of the reachability analysis with a coverage classification module that is coupled with the coverage reachability module; and generate, with a coverage information mechanism coupled with the coverage classification module, a coverage graph indicating an amount of formal verification coverage provided by the property based on a first set of the classified cover items with a coverage information mechanism coupled with the coverage classification module, wherein the classified cover items in the first set correspond to the cone of influence of the property and are reached within a bound during the reachability analysis, and the coverage graph indicates one or more changes of the classified cover items across a plurality of bounds.

\* \* \* \* \*